United States Patent
Ohkubo et al.

(10) Patent No.: US 6,560,260 B1
(45) Date of Patent: May 6, 2003

(54) RIDGE WAVEGUIDE SEMICONDUCTOR LASER DIODE

(75) Inventors: Michio Ohkubo, Tokyo (JP);
Yoshikazu Ikegami, Tokyo (JP);
Takeshi Namegaya, Tokyo (JP);
Akihiko Kasukawa, Tokyo (JP)

(73) Assignee: The Furukawa Electric Co., Ltd., Toyko (JP)

( * ) Notice: Subject to any disclaimer, the term of this patent is extended or adjusted under 35 U.S.C. 154(b) by 0 days.

(21) Appl. No.: 09/201,245

(22) Filed: Nov. 30, 1998

(51) Int. Cl.[7] .................................................. H01S 5/00
(52) U.S. Cl. ......................................... 372/46; 372/45
(58) Field of Search ............................... 372/46, 45, 50

(56) References Cited

U.S. PATENT DOCUMENTS 5,394,424 A  2/1995  Ijichi et al. .................... 372/46

FOREIGN PATENT DOCUMENTS

| JP | 6-037389 | 2/1994 | H01S/3/18 |
|----|----------|--------|-----------|
| JP | 6-188513 | 7/1994 | H01S/3/18 |
| JP | 7-030199 | 1/1995 | H01S/3/18 |
| JP | 7-283484 | 10/1995 | H01S/3/18 |
| JP | 09-307184 | * 11/1997 | |

OTHER PUBLICATIONS

Savolainen et al, "High–Performance 980–nm Strained––Layer GaInAs–GaInAsP–GaInP Quantum–Well Lasers Grown by All Solid–Source, Molecular–Beam Epitaxy", IEEE Photonics Technology Letters, vol. 8, No. 8, Aug. 1996, pp. 986–988.*

Asonen et al, "High–Power Operation of Aluminum–Free (lambda=0.98 um) Pump Laser for Erbium–Doped Fiber Amplifier", IEEE Photonics Technology Letters, vol. 5, No. 6, Jun. 1993, pp. 589–591.*

* cited by examiner

Primary Examiner—Quyen Leung
(74) Attorney, Agent, or Firm—Coudert Brothers LLP

(57) ABSTRACT

A GaAs based semiconductor laser has a combination of cladding layers including a ridge structure part and a remaining part sandwiching therebetween an etch stop layer. The remaining part overlies the entire surface of laser active layers and has a thickness "D" which satisfies $D \geq W \times 0.5$ wherein W is the width of a spot size having a strength of $1/e^2$ for a near field pattern in the active layer in a direction perpendicular to the active layer, wherein "e" is the bottom of the natural logarithm.

19 Claims, 1 Drawing Sheet

RIDGE WAVEGUIDE SEMICONDUCTOR LASER DIODE

BACKGROUND OF THE INVENTION (a) Field of the Invention

The present invention relates to a semiconductor laser diode, and more particularly, to a ridge waveguide semiconductor laser diode having a high output power and an excellent laser characteristic.

(b) Description of the Related Art

GaAs based quantum well laser diodes having an InGaAs strained quantum well active layer have been intensively researched and developed for a practical use. For realizing the above object, it is desired to increase the optical output of the laser diode. For instance, when a laser diode is used at a lasing wavelength of 0.98 μm as an exciting light source for an erbium-doped fiber for use in a 1.5 μm band optical fiber amplifier, or when a laser diode is used at a lasing wavelength of 1.02 μm as an exciting light source for a praseodymium-doped fiber for use in a 1.3 μm band optical fiber amplifier, the laser diode is required to have a high output power of about 200 mW.

Referring to FIG. 1, a typical GaAs based quantum well laser diode will be described as an example. A layer structure 10 of a conventional ridge waveguide GaAs laser diode includes, for instance, a buffer layer 14 having GaAs or AlGaAs based compound semiconductor layer, a lower cladding layer 16, a first light confinement layer 18, a second light confinement layer 20, a first strained quantum well layer 22, a barrier layer 24, a second strained quantum well layer 26, a third light confinement layer 28, a fourth light confinement layer 30, a first upper cladding layer 32, an etch stop layer 34, a second upper cladding layer 36, and a cap layer 38 consecutively formed on a n-GaAs substrate 12. The second upper cladding layer 36 and the cap layer 38 overlying the etch stop layer 34 have a mesa structure.

The chief factor for restricting the increase of the optical output from the GaAs based quantum well laser diode is catastrophic optical damage (COD) which signifies that the optical facet of the laser diode is damaged instantaneously. When the optical output increases to reach a specific value, the COD which is inherent in the GaAs based laser diode is generated to stop the function of the laser diode at the instant.

For preventing the generation of COD failure, for instance, a conventional wide mesa structure of about 4 μm is adopted to decrease the optical density in the active layers; however, in case of the wide mesa structure, a so-called spatial-hole-burning wherein the optical gain of the laser diode is uneven in the direction parallel to the axis of the active layers arises to thereby tend to generate a beam steering phenomenon.

The beam steering phenomenon is known in the art and means that the light beam moves in the direction parallel to the active layers, which causes the characteristic of the optical output with respect to injected current in the semiconductor laser diode to be non-linear to have a kink in the characteristic, thereby deteriorating the laser characteristic significantly. The non-linearity means that the external differentiated quantum efficiency "η" ($=dL/d(I-I_{TH})$) does not remain as a constant, wherein "L" represents the optical output, "I" represents the injected current at the optical output of "L", and "$I_{TH}$" represents a threshold current. In a more extreme case, "η" sometimes becomes almost 0. Accordingly, signal conversion cannot be effected from the injected current due to the deteriorated laser characteristic. This is particularly critical when the laser diode is coupled to an optical fiber.

For preventing the generation of the problem beam steering phenomenon in a high output power range, it is necessary to consider complicated and various effects such as the waveguide mode control of the active layers and thus, the problem is not solved in the conventional GaAs quantum well laser diode.

SUMMARY OF THE INVENTION

It is therefore an object of the present invention to provide a ridge waveguide semiconductor laser diode having a linear characteristic between the optical output and the injected current in a high optical output range.

The present invention provides a ridge waveguide semiconductor laser diode including a semiconductor substrate, at least one active layer overlying the semiconductor substrate, and at least one cladding layer having a ridge structure part and an underlying remaining part overlying substantially the entire surface of the active layer.

The remaining part has a thickness "D" defined by:

$$D \geq W \times 0.5,$$

wherein "W" is a width of a spot size having a strength of $1/e^2$ for a near field pattern in the active layer in a direction perpendicular to the active layer, where "e" represents the base of the natural logarithm.

In accordance with the semiconductor laser diode of the present invention, due to the value for "D", the characteristic of the optical output with respect to injected current caused by a beam steering phenomenon can be improved in terms of the kink, as a result of which an excellent linear characteristic can be obtained in a higher output power.

The above and other objects, features and advantages of the present invention will be more apparent from the following description, referring to the accompanying drawings.

BRIEF DESCRIPTION OF DRAWINGS

The single FIGURE is a cross-sectional view of a typical ridge waveguide semiconductor laser diode.

PREFERRED EMBODIMENT OF THE INVENTION

Figure 1:
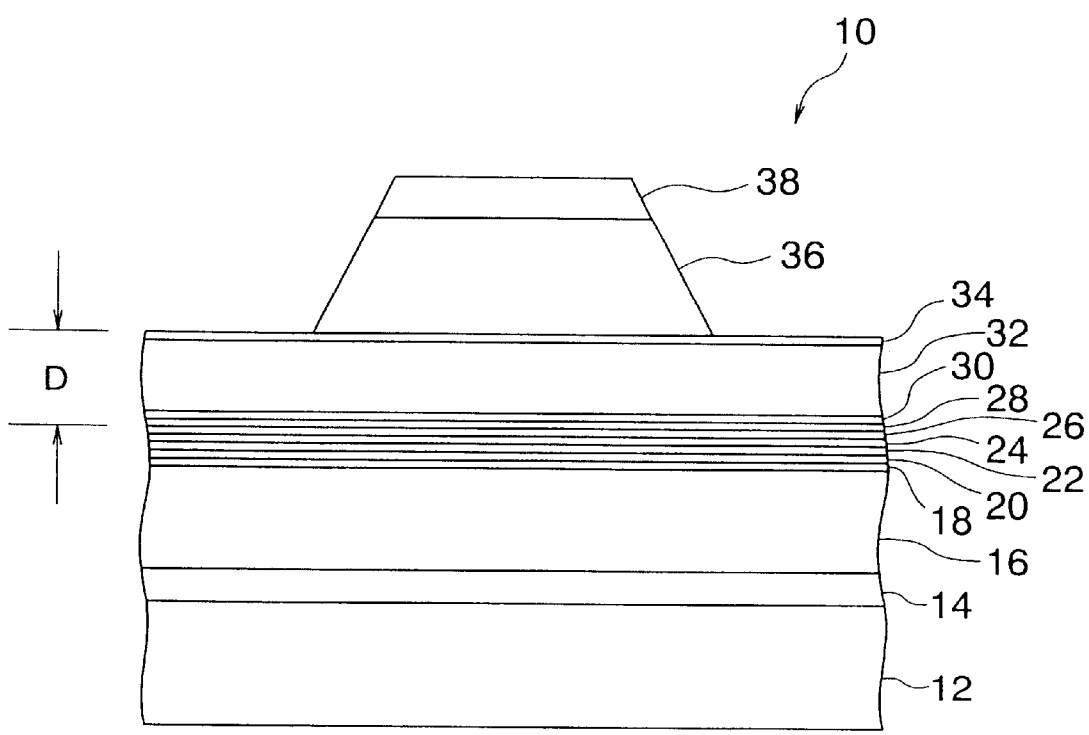

For devising the present invention, the inventors first noted that the optical density in the active layers was inversely proportional to the product of the longitudinal size and the transverse size of the optical spot, and that the size of the transverse confinement, or the transverse spot size could be controlled based on the remaining thickness D of the cladding layers overlying the entire surface of the active layers. The remaining thickness "D" as used herein is represented by the thickness of a part of the cladding layers underlying the ridge structure part of the cladding layers. That is, the remaining thickness is represented in the attached Figure by the total thickness of the third and fourth optical confinement layers 28 and 30, the first upper cladding layer 36 and the etch stop layer.

In addition to the above findings, the inventors considered that, in the case of a ridge waveguide semiconductor laser diode having a wide mesa structure for reducing the optical density therein, the beam steering phenomenon does not arise in the high optical output power range, to thereby maintain a constant value for the external differentiated quantum efficiency η if a specific relationship holds between the width W of the longitudinal spot size and the remaining thickness D of the cladding layers.

The inventors then determined the relationship among the output power generating the kink, and the above W and D. In the text, the words "output power generating the kink (or kink output)" as used herein mean an optical output power of injected current which provides inconstant value for the external differentiated quantum efficiency η, for example, an output power providing a rate of change for η as high as 20%.

Now, the present invention is described more specifically based on a preferred embodiment thereof with reference to the accompanying drawing.

An epitaxial growth was conducted to grow compound semiconductor layers on an n-GaAs substrate 12 by using a Metal Organic Chemical deposition method to fabricate a layer structure 10 of the GaAs based semiconductor laser diode shown in FIG. 1. The layer structure include the following layers conecutively from the bottom.

buffer layer 14: n-GaAs layer, lower cladding layer 16: n-$Al_{0.3}Ga_{0.7}As$ layer, first light confinement layer 18: $Al_{0.2}Ga_{0.8}As$ layer, second light confinement layer 20: $GaAs_{0.94}P_{0.06}$ layer, first strained quantum well layer 22: $In_{0.2}Ga_{0.8}As$ layer, barrier layer 24: $GaAs_{0.94}P_{0.06}$ layer, second strained quantum well layer 26: $In_{0.2}Ga_{0.8}As$ layer, third light confinement layer 28: $GaAs_{0.94}P_{0.06}$ layer, a fourth light confinement layer 30: $Al_{0.2}Ga_{0.8}As$ layer, first upper cladding layer 32: p-$Al_{0.3}Ga_{0.7}As$ layer, etch stop layer 34: p-$In_{0.5}Ga_{0.5}P$ layer, second upper cladding layer 36: p-$Al_{0.3}Ga_{0.7}As$ layer, cap layer 38: p-GaAs layer.

Subsequently, a SiN film was formed on the cap layer 38, and used as a mask for etching the second upper cladding layer 36 by a wet etching using citric acid. The etching was stopped by the etch stop layer 34, thereby forming the second cladding layer 36 in the mesa structure of 4μm width.

Then, another SiN film was formed over the entire surface including the mesa structure. The another SiN film was removed from the surface of the cap layer 38 to expose the cap layer 38. A p-electrode was formed on the exposed cap layer 38, and an n-electrode was formed on the bottom surface of the substrate 12.

Thereafter, a dielectric film having a reflectivity of 10% was formed by coating on the low reflection facet of the laser structure and another dielectric film having a reflectance of 95% was formed on the high reflection facet, to complete a semiconductor laser diode.

For fabricating the sample semiconductor laser diodes, the thicknesses of first light confinement layer 18, second light confinement layer 20, third light confinement layer 28, fourth light confinement layer 30, and first upper cladding layer 32 were changed as described later. Each thickness of other layers is fixed as follows:

buffer layer 14: 0.5 μm, lower cladding layer 16: 2.0 μm, etch stop layer 34: 3 μm, second upper cladding layer 36: 2.0 μm, cap layer 38: 0.5 μm.

The thickness d1 of the first light confinement layer 18 was adjusted to be equal to the thickness of the fourth light confinement layer 30. The thickness d2 of the second light confinement layer 20 was adjusted to be equal to the thickness of the third light confinement layer 28. As shown in Table 1, d1 and d2 were set at different values in each combination of "a" to "i".

By the combination of the various values for d1 and d2, the spot size width "W" of the near-field pattern in the active layers including first and second light confinement layers 18 and 20, first strained quantum well layer 22, barrier layer 24, second strained quantum well layer 26, and third and fourth light confinement layers 28 and 30 can be changed.

TABLE 1

|        | a   | b  | c  | d  | E  | f  | g  | h  | i  |
|--------|-----|----|----|----|----|----|----|----|----|
| d1 (nm) | 100 | 90 | 90 | 70 | 70 | 50 | 50 | 30 | 30 |
| d2 (nm) | 10  | 20 | 10 | 20 | 10 | 20 | 10 | 20 | 10 |

In addition, independently of the combination of the values for D1 and D2, the sum "D" of film thicknesses of the cladding layers formed over the entire active layers, that is, third light confinement layer 28, fourth light confinement layer 30, and first upper cladding layer 32 was set at different value for each number (No.) as shown in Table 2.

TABLE 2

| No. | Thickness D(μm) |
|-----|-----------------|
| 1   | 0.300           |
| 2   | 0.600           |
| 3   | 0.700           |
| 4   | 0.720           |
| 5   | 0.750           |
| 6   | 0.770           |
| 7   | 0.790           |
| 8   | 0.820           |
| 9   | 0.840           |
| 10  | 0.920           |
| 11  | 0.950           |
| 12  | 0.970           |
| 13  | 1.020           |
| 14  | 1.070           |
| 15  | 1.120           |

In the experiments, different combinations "a" to "i" of d1 and d2 in Table 1 and No. for the film thickness "D" of the first upper cladding layer 32 in Table 2 were sampled, as shown in Table 3. For instance, a combination a-6 was formed wherein the values of d1 and d2 were derived from the combination "a", that is, d1=100 nm, d2=10 nm, and No. for "D" is derived from No. 6, that is, D=0.77 μm. Then, a sample semiconductor laser diode having a combination of a-6 was fabricated to have the specified values for d1, d2, and "D". Other combinations a-1 to i-6 for sample semiconductor laser diodes were formed similarly.

In operation of the sample semiconductor laser diodes, the spot size width "W" and the optical output were increased to generate the kink, to measure the output power generating the kink, or kink output (mW). The results are shown in Table 3 to Table 6 together with the value for "D" in the combination and the calculated value of D/W.

TABLE 3

| combination | W (μm) | D (μm) | D/W   | Kink output (mW) | evaluation |
|-------------|--------|--------|-------|------------------|------------|
| a-1         | 1.12   | 0.300  | 0.269 | 124              | NG         |
| a-1         | 1.12   | 0.300  | 0.269 | 113              | NG         |
| a-1         | 1.13   | 0.300  | 0.265 | 126              | NG         |

TABLE 3-continued

| combination | W (μm) | D (μm) | D/W | Kink output (mW) | evaluation |
|---|---|---|---|---|---|
| a-1 | 1.15 | 0.300 | 0.261 | 129 | NG |
| a-5 | 1.14 | 0.750 | 0.658 | 219 | OK |
| a-6 | 1.13 | 0.770 | 0.682 | 205 | OK |
| a-6 | 1.14 | 0.770 | 0.673 | 209 | OK |
| b-1 | 1.16 | 0.300 | 0.259 | 124 | NG |
| b-1 | 1.17 | 0.300 | 0.257 | 106 | NG |
| b-1 | 1.17 | 0.300 | 0.256 | 122 | NG |
| b-1 | 1.17 | 0.300 | 0.256 | 131 | NG |
| b-1 | 1.18 | 0.300 | 0.255 | 121 | NG |
| b-1 | 1.20 | 0.300 | 0.250 | 112 | NG |
| b-6 | 1.16 | 0.770 | 0.663 | 242 | OK |
| c-1 | 1.20 | 0.300 | 0.249 | 125 | NG |
| c-1 | 1.21 | 0.300 | 0.248 | 131 | NG |
| c-1 | 1.23 | 0.300 | 0.245 | 118 | NG |
| c-6 | 1.23 | 0.770 | 0.626 | 190 | OK |
| c-6 | 1.24 | 0.770 | 0.622 | 195 | OK |
| c-12 | 1.22 | 0.970 | 0.797 | 210 | OK |
| c-12 | 1.25 | 0.970 | 0.777 | 296 | OK |
| c-15 | 1.23 | 1.120 | 0.911 | 207 | OK |
| c-15 | 1.24 | 1.120 | 0.901 | 280 | OK |

TABLE 4

| combination | W (μm) | D (μm) | D/W | Kink output (mW) | evaluation |
|---|---|---|---|---|---|
| d-4 | 1.28 | 0.720 | 0.564 | 191 | OK |
| d-7 | 1.28 | 0.790 | 0.619 | 235 | OK |
| d-7 | 1.28 | 0.790 | 0.619 | 226 | OK |
| d-7 | 1.29 | 0.790 | 0.614 | 205 | OK |
| d-7 | 1.29 | 0.790 | 0.612 | 208 | OK |
| d-8 | 1.25 | 0.820 | 0.655 | 244 | OK |
| d-12 | 1.28 | 0.970 | 0.757 | 296 | OK |
| d-12 | 1.29 | 0.970 | 0.751 | 301 | OK |
| d-12 | 1.30 | 0.970 | 0.749 | 254 | OK |
| d-15 | 1.25 | 1.120 | 0.894 | 267 | OK |
| d-15 | 1.27 | 1.120 | 0.884 | 254 | OK |
| e-2 | 1.33 | 0.600 | 0.451 | 102 | NG |
| e-4 | 1.32 | 0.720 | 0.547 | 204 | OK |
| e-7 | 1.33 | 0.790 | 0.594 | 196 | OK |
| e-8 | 1.31 | 0.820 | 0.628 | 191 | OK |
| e-9 | 1.31 | 0.840 | 0.643 | 283 | OK |
| e-9 | 1.32 | 0.840 | 0.638 | 245 | OK |
| e-10 | 1.33 | 0.920 | 0.691 | 207 | OK |
| e-12 | 1.31 | 0.970 | 0.743 | 243 | OK |
| e-12 | 1.32 | 0.970 | 0.737 | 203 | OK |
| e-13 | 1.34 | 1.020 | 0.761 | 269 | OK |
| e-16 | 1.32 | 1.130 | 0.856 | 345 | OK |

TABLE 5

| combination | W (μm) | D (μm) | D/W | Kink output (mW) | evaluation |
|---|---|---|---|---|---|
| f-2 | 1.35 | 0.600 | 0.444 | 138 | NG |
| f-2 | 1.36 | 0.600 | 0.440 | 131 | NG |
| f-2 | 1.36 | 0.600 | 0.440 | 118 | NG |
| f-9 | 1.35 | 0.840 | 0.621 | 252 | OK |
| f-9 | 1.37 | 0.840 | 0.612 | 234 | OK |
| f-10 | 1.39 | 0.920 | 0.660 | 202 | OK |
| f-12 | 1.36 | 0.970 | 0.715 | 197 | OK |
| f-12 | 1.36 | 0.970 | 0.715 | 194 | OK |
| f-13 | 1.39 | 1.020 | 0.731 | 195 | OK |
| f-14 | 1.35 | 1.070 | 0.792 | 261 | OK |
| f-14 | 1.36 | 1.070 | 0.785 | 296 | OK |
| f-14 | 1.41 | 1.070 | 0.761 | 209 | OK |
| f-15 | 1.36 | 1.120 | 0.822 | 271 | OK |
| g-2 | 1.42 | 0.600 | 0.422 | 142 | NG |
| g-3 | 1.45 | 0.700 | 0.484 | 143 | NG |
| g-10 | 1.45 | 0.920 | 0.636 | 238 | OK |
| g-11 | 1.45 | 0.950 | 0.657 | 254 | OK |
| g-12 | 1.42 | 0.970 | 0.684 | 298 | OK |
| g-13 | 1.42 | 1.020 | 0.720 | 302 | OK |
| g-13 | 1.44 | 1.020 | 0.708 | 218 | OK |

TABLE 5-continued

| combination | W (μm) | D (μm) | D/W | Kink output (mW) | evaluation |
|---|---|---|---|---|---|
| g-13 | 1.42 | 1.030 | 0.724 | 256 | OK |
| g-14 | 1.41 | 1.070 | 0.758 | 226 | OK |

TABLE 6

| combination | W (μm) | D (μm) | D/W | Kink output (MW) | evaluation |
|---|---|---|---|---|---|
| h-3 | 1.49 | 0.700 | 0.470 | 167 | NG |
| h-13 | 1.46 | 1.020 | 0.697 | 215 | OK |
| i-3 | 1.52 | 0.700 | 0.461 | 158 | NG |
| i-3 | 1.53 | 0.700 | 0.457 | 127 | NG |
| i-6 | 1.50 | 0.770 | 0.513 | 235 | OK |

A kink output of at least 200 mW is desired in a practical GaAs quantum well laser diode. In Table 3, the combinations having a kink output of 200 mW or more are evaluated as satisfactory (OK), the combinations having a kink output of less than 200 mW are evaluated as NG.

From the above results, when D/W≧0.5, the evaluation is "OK". A practical GaAs based quantum well laser diode having a high output power is achievable by having a relationship D/W≧0.5.

Based on the above results, the feature of the ridge waveguide semiconductor laser diode of the present embodiment is such that the laser diode has a fixed thickness part in the cladding layers which forms a mesa structure, and the remaining part of the cladding layers overlies the entire surface of the active layers, wherein the remaining part has a thickness "D" which satisfies D≧W×0.5. The spot size width "W" is referred to as a width of the spot size having a value of $1/e^2$ for the strength of the near-field pattern in the active layers in the direction perpendicular to the active layers, given "e" representing the bottom of the natural logarithm.

In the present invention, the cladding layers are not limited to only an upper cladding layer, and include various layers having a function similar to the cladding layer and formed as a portion of the remaining part overlying the entire active layers. The cladding layers include the light confinement layer in this embodiment.

In the present embodiment, a desired value is first set for the spot size width "W" of the near-field pattern in the direction perpendicular to the active layers. Provided that the half value all angle of a far-field pattern (FFP) in the longitudinal direction is represented by "θ", the spot size "W" is calculated, for instance, as follows:

$$W = \lambda/\pi \, \tan(\theta/(2 \ln 2)^{0.5})$$

wherein "λ" represents the wave length, and "ln" represents the natural logarithm.

The remaining thickness "D" in the upper cladding layer is obtained from the correlation of D≧W×0.5. For instance, when the spot size width "W" is 1.3 μm, the value for "D" is such that D≧1.3×0.5, that is, 0.65 μm or more. The layer structure 10 shown in FIG. 1 is formed to have the thickness "D" in the upper cladding layers at 0.65 μm or more.

The remaining thickness "D" in FIG. 1 is defined by the sum of thicknesses of the layers disposed between second strained quantum well layer 26 and the etch stop layer 34, that is, third light confinement layer 28, fourth light confinement layer 30, first upper cladding layer, and etch stop layer 34.

In the present embodiment, although the etch stop layer made of $In_{0.5}Ga_{0.5}P$ is used for controlling the remaining thickness "D" of the cladding layers remaining above the active layers, it is possible to control the remaining thickness "D" by another method instead of using the etch stop layer.

Since the above embodiments are described only for examples, the present invention is not limited to the above embodiments and various modifications or alterations can be easily made therefrom by those skilled in the art without departing from the scope of the present invention.

What is claimed is:

1. A ridge waveguide semiconductor laser diode comprising a semiconductor substrate, at least one active layer overlying said semiconductor substrate, at least one cladding layer having a ridge structure part and an underlying remaining part, said remaining part overlying substantially an entire surface of said active layer and having a thickness "D", and a spot of emitted light having a spot size width "W" at a power level of $1/e^2$ of maximum for a near-field pattern measured in a direction perpendicular to said at least one active layer, where "e" is the base of the natural logarithm, and wherein D and W satisfy the relation:

$$D \geq W \times 0.5.$$

2. The ridge waveguide semiconductor laser diode as defined in claim 1, wherein said active layer is a GaAs based layer.

3. The ridge waveguide semiconductor laser diode as defined in claim 1, further comprises an etch stop layer between said ridge structure part and said remaining part.

4. The ridge waveguide semiconductor laser diode as defined in claim 1, wherein said at least one cladding layer include a light confinement layer.

5. The ridge waveguide semiconductor laser diode of claim 1, wherein D is in a range spanning from 0.3 μm to 1.12 μm.

6. The ridge waveguide semiconductor laser diode of claim 1, wherein W is in a range spanning from 1.13 μm to 1.5 μm.

7. The ridge waveguide semiconductor laser diode of claim 1, wherein said waveguide semiconductor laser diode outputs light without kinks for output power levels of 200 mW and below.

8. The ridge waveguide semiconductor laser diode of claim 1, wherein D is greater than or equal to 0.72 μm.

9. The ridge waveguide semiconductor laser diode of claim 1, wherein D and W satisfy the further relation: $D/W \leq 0.911$.

10. A ridge waveguide semiconductor laser diode comprising a semiconductor substrate, at least one active layer overlying said semiconductor substrate, at least one cladding layer comprising arsenic and having a ridge structure part and an underlying remaining part, said remaining part overlying substantially an entire surface of said active layer and having a thickness "D", and a spot of emitted light having a width "W" at an output power of $1/e^2$ for a near-field pattern measured in a direction perpendicular to said at least one active layer, where "e" is the base of the natural logarithm, and wherein D and W satisfy the relation:

$$D \geq W \times 0.5.$$

11. The ridge waveguide semiconductor laser diode of claim 10, wherein the at least one cladding layer comprises AlGaAs material.

12. The ridge waveguide semiconductor laser diode as defined in claim 10, wherein said active layer is a GaAs based layer.

13. The ridge waveguide semiconductor laser diode as defined in claim 10, further comprises an etch stop layer between said ridge structure part and said remaining part.

14. The ridge waveguide semiconductor laser diode as defined in claim 10, wherein said at least one cladding layer includes a light confinement layer.

15. The ridge waveguide semiconductor laser diode of claim 10, wherein D is in a range spanning from 0.3 μm to 1.12 μm.

16. The ridge waveguide semiconductor laser diode of claim 10, wherein W is in a range spanning from 1.13 μm to 1.5 μm.

17. The ridge waveguide semiconductor laser diode of claim 10, wherein said waveguide semiconductor laser diode outputs light without kinks for output power levels of 200 mW and below.

18. The ridge waveguide semiconductor laser diode of claim 10, wherein D is greater than 0.72 μm.

19. The ridge waveguide semiconductor laser diode of claim 10, wherein D and W satisfy the further relation: $D/W \leq 0.911$.

* * * * *